(12) United States Patent
Wu et al.

(10) Patent No.: US 10,797,029 B2
(45) Date of Patent: Oct. 6, 2020

(54) STRUCTURE WITH MICRO DEVICE

(71) Applicant: PlayNitride Inc., Tainan (TW)

(72) Inventors: Chih-Ling Wu, Tainan (TW); Yi-Min Su, Tainan (TW); Yu-Yun Lo, Tainan (TW)

(73) Assignee: PlayNitride Inc., Hsinchu County (TW)

( * ) Notice: Subject to any disclaimer, the term of this patent is extended or adjusted under 35 U.S.C. 154(b) by 0 days.

(21) Appl. No.: 16/212,698

(22) Filed: Dec. 7, 2018

(65) Prior Publication Data

US 2019/0189602 A1 Jun. 20, 2019

Related U.S. Application Data

(60) Provisional application No. 62/607,325, filed on Dec. 19, 2017.

(30) Foreign Application Priority Data

Jun. 5, 2018 (TW) .............................. 107119258 A

(51) Int. Cl.
*H01L 25/13* (2006.01)
*H01L 33/48* (2010.01)
(Continued)

(52) U.S. Cl.
CPC .............. *H01L 25/13* (2013.01); *H01L 24/00* (2013.01); *H01L 24/95* (2013.01); *H01L 33/483* (2013.01);
(Continued)

(58) Field of Classification Search
CPC ......... H01L 25/13; H01L 24/00; H01L 24/95; H01L 33/483; H01L 24/05; H01L 24/06;
(Continued)

(56) References Cited

U.S. PATENT DOCUMENTS 10,403,799 B1 * 9/2019 Wu ......................... H01L 33/32
2013/0228793 A1 9/2013 Kim et al.
(Continued)

FOREIGN PATENT DOCUMENTS

| CN | 102520832 | 6/2012 |
| CN | 104680939 | 6/2015 |

(Continued)

OTHER PUBLICATIONS

"Office Action of Taiwan Related Application No. 107119255", dated Feb. 27, 2019, pp. 1-8.
(Continued)

*Primary Examiner* — Fernando L Toledo
*Assistant Examiner* — Valerie N Newton
(74) *Attorney, Agent, or Firm* — JCIPRNET

(57) ABSTRACT

A structure with micro device includes a substrate, a plurality of micro devices, and a plurality of holding structures. The micro devices are disposed on the substrate and arranged in multiple rows. Each of the micro devices has a top surface. The holding structures are respectively disposed on the top surface of each of the micro devices and extend to the substrate. Distances between the holding structure on the micro devices on any one of the rows and the holding structures on the micro devices on two adjacent rows are different.

21 Claims, 13 Drawing Sheets

(51) Int. Cl.
*H01L 23/00* (2006.01)
*H01L 25/075* (2006.01)
*H01L 33/00* (2010.01)

(52) U.S. Cl.
CPC .............. *H01L 24/05* (2013.01); *H01L 24/06* (2013.01); *H01L 25/0753* (2013.01); *H01L 33/0095* (2013.01); *H01L 2221/68368* (2013.01); *H01L 2224/05553* (2013.01); *H01L 2224/05554* (2013.01); *H01L 2224/0603* (2013.01); *H01L 2224/95001* (2013.01); *H01L 2924/00014* (2013.01); *H01L 2924/12041* (2013.01)

(58) Field of Classification Search
CPC ............... H01L 25/0753; H01L 33/095; H01L 221/68368; H01L 2224/05553; H01L 2224/05554; H01L 2224/95001; H01L 2924/00014; H01L 2924/12041
See application file for complete search history.

(56) References Cited

U.S. PATENT DOCUMENTS

| | | |
|---|---|---|
| 2015/0236203 A1 | 8/2015 | Oh et al. |
| 2015/0349205 A1 | 12/2015 | Chen et al. |
| 2016/0072012 A1 | 3/2016 | Chen et al. |
| 2016/0086855 A1* | 3/2016 | Bower ................. B81C 99/008 438/110 |
| 2016/0351548 A1 | 12/2016 | Chen et al. |
| 2017/0062666 A1 | 3/2017 | Bang et al. |
| 2019/0189495 A1 | 6/2019 | Wu et al. |

FOREIGN PATENT DOCUMENTS

| | | |
|---|---|---|
| CN | 204668356 | 9/2015 |
| CN | 106816408 | 6/2017 |
| TW | 200644265 | 12/2006 |
| TW | 200950159 | 12/2009 |
| TW | I363437 | 5/2012 |
| TW | I455273 | 10/2014 |
| TW | 201620167 | 6/2016 |
| TW | 201701510 | 1/2017 |
| TW | 201705544 | 2/2017 |

OTHER PUBLICATIONS

Chih-Ling Wu, et al., "Structure With Micro Device," Unpublished U.S. Appl. No. 16/212,690, filed Dec. 7, 2018, The specification, claims, and the drawings of the unpublished pending U.S. application have been stored in the Image File Wrapper (IFW) system.
Chih-Ling Wu, et al., "Structure With Micro Device," Unpublished U.S. Appl. No. 16/212,697, filed Dec. 7, 2018, The specification, claims, and the drawings of the unpublished pending U.S. application have been stored in the Image File Wrapper (IFW) system.
Chih-Ling Wu, et al., "Structure With Micro Device," Unpublished U.S. Appl. No. 16/513,733, filed Jul. 17, 2019, The specification, claims, and the drawings of the unpublished pending U.S. application have been stored in the Image File Wrapper (IFW) system.
"Notice of allowance of U.S. Appl. No. 16/212,697", dated Apr. 24, 2019, pp. 1-9.
"Office Action of Taiwan Related Application, application No. 107119254", dated Aug. 23, 2019, p. 1-p. 6.

* cited by examiner

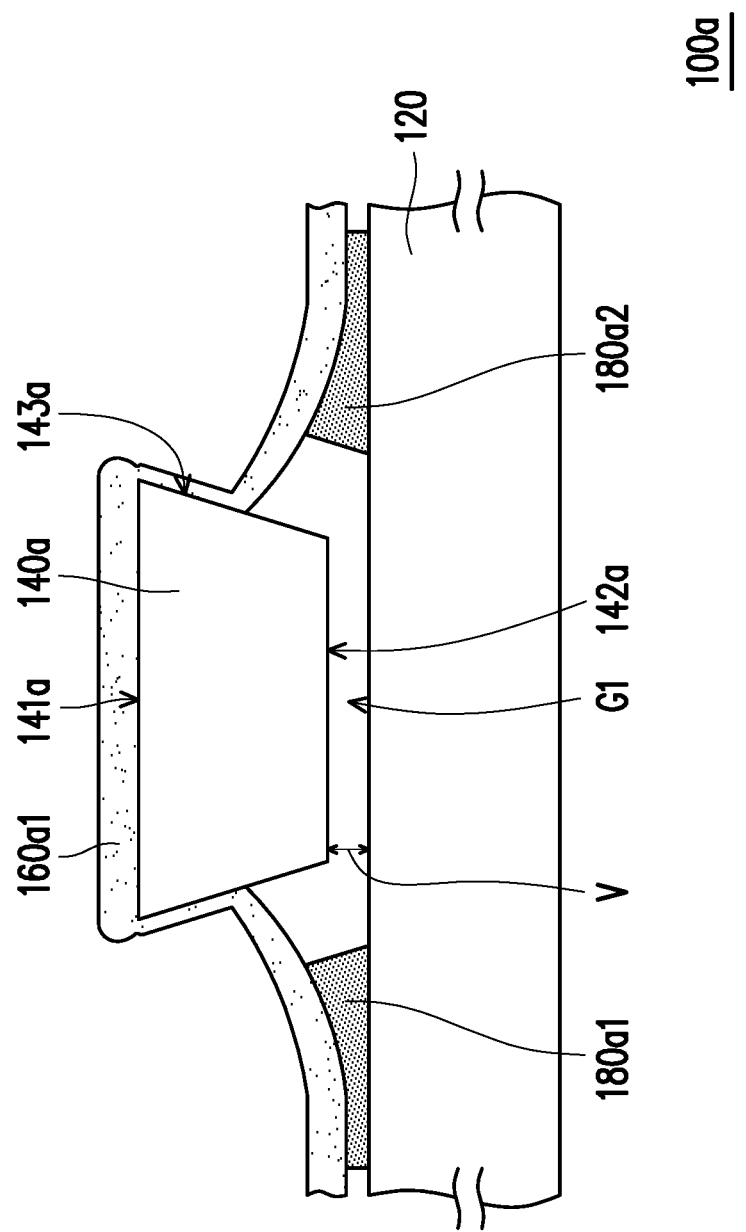

STRUCTURE WITH MICRO DEVICE

CROSS-REFERENCE TO RELATED APPLICATION

This application claims the priority benefits of U.S. provisional application Ser. No. 62/607,325, filed on Dec. 19, 2017 and Taiwan application serial no. 107119258, filed on Jun. 5, 2018. The entirety of each of the above-mentioned patent applications is hereby incorporated by reference herein and made a part of this specification.

BACKGROUND

Field of the Invention

The invention relates to a semiconductor structure, and more particularly, to a structure with micro device.

Description of Related Art

At present, transferring micro light-emitting diodes (LEDs) from a carrier to a receiving substrate is mainly done via an electrostatic force or a magnetic force. In general, micro LEDs are held by holding structures, so that it is easier for the micro LEDs to be picked up from the substrate, transported and transferred to be placed on the receiving substrate, and the micro LEDs are secured by the holding structures to prevent the quality of the micro LEDs from being affected by external factors during the substrate-transfer process. However, positions where the holding structures are disposed on the micro LEDs may influence a transportation and transfer yield of the micro LEDs. Therefore, how to allow the holding structures to temporarily hold the micro LEDs for the micro LEDs to be transported and transferred between the substrate and the receiving substrate more easily and efficiently has become an important subject in the industry.

SUMMARY

The invention provides a structure with micro device capable of effectively improving a transportation and transfer yield of micro devices.

A structure with micro device of the invention includes a substrate, a plurality of micro devices, and a plurality of holding structures. The micro devices are disposed on the substrate and arranged in a plurality of rows. Each of the micro devices has a top surface. The holding structures are respectively disposed on the top surface of each of the micro devices and extend to the substrate. Distances between the holding structure on the micro devices on any one of the rows and the holding structures on the micro devices on two adjacent rows are different.

In an embodiment of the invention, each of the micro devices includes a first-type electrode and a second-type electrode, the first-type electrode or the second-type electrode is located on the top surface, and the holding structures are away from the first-type electrodes or the second-type electrodes.

In an embodiment of the invention, orthographic projections of the holding structures on the substrate overlap an orthographic projection of a gravity center of each of the micro devices on the substrate.

In an embodiment of the invention, there is a distance between the holding structures and a center of the top surface of each of the micro devices.

In an embodiment of the invention, wherein the holding structures overlaps the center of the top surface of each of the micro devices.

In an embodiment of the invention, wherein there is a distance between the orthographic projection of each of the holding structures on the substrate and the orthographic projection of a center of each of the micro devices on the substrate.

In an embodiment of the invention, the first-type electrodes or the second-type electrodes of the micro devices on two adjacent rows are adjacent to each other, and a ratio of a first distance between the adjacent holding structures corresponding to the second-type electrodes on two adjacent rows to a second distance between the adjacent holding structures corresponding to the first-type electrodes on two adjacent rows is less than 1 and greater than or equal to 0.6.

In an embodiment of the invention, each of the holding structures includes at least one holding portion, the holding portion is located on an edge of each of the micro devices, and a ratio of a width of the holding portion on the edge to a side length of the edge is between 0.01 and 0.6.

In an embodiment of the invention, the at least one holding portion includes a plurality of holding portions and the holding portions are separated from each other.

In an embodiment of the invention, a minimal distance between an orthographic projection of each of the holding portions on the substrate and the orthographic projection of the center of each of the micro devices on the substrate is the same.

In an embodiment of the invention, a minimal distance between each of the holding portions and a center of the top surface of each of the micro devices is the same.

In an embodiment of the invention, the minimal distance between the center of the top surface of each of the micro devices and each of the holding structures is less than or equal to ½ of a minimal side length of the top surface.

In an embodiment of the invention, there is a maximal distance between the holding portion and the corresponding edge of the top surface, and a ratio of the maximal distance to the side length of the corresponding edge of the micro device is less than or equal to 0.2.

In an embodiment of the invention, the structure with micro device further includes a plurality of buffer structures. The bufferstructures are disposed between the holding structures and the substrate. The holding structures are connected to the substrate through the buffer structures, and the material of the buffer structures is different from the material of the holding structures.

In an embodiment of the invention, within a unit area, a ratio of an orthographic projection area of the buffer structures on the substrate to an orthographic projection area of the holding structure on the substrate is between 0.2 and 0.9.

In an embodiment of the invention, the buffer structures are away from each of the micro devices.

In an embodiment of the invention, orthographic projections of the buffer structures on the substrate are separated from the orthographic projection of each of the micro devices on the substrate by a minimal distance, and the minimal distance is less than or equal to 10 μm.

In an embodiment of the invention, intervals between the micro devices on any one of the rows and the micro devices on two adjacent rows are the same.

In an embodiment of the invention, the holding structure on the micro devices on each of the rows has a symmetric centerline, and distances between the symmetric centerline on any one of the rows and the symmetric centerlines on two adjacent rows are different.

To sum up, in the design of the structure with micro device of the invention, the micro devices are disposed on the substrate and arranged in multiple rows, and the holding structures are respectively disposed on the top surface of each of the micro devices, wherein the distances between the holding structure on any one of the micro devices and the holding structures on the micro devices on two adjacent rows are different. With this design, not only the process margin can be increased, but also the micro devices, when being transported and transferred between different substrates to be applied to a display with micro device, can be provided with preferable fixing, supporting and connection via the holding structures, so as to average the force when the micro devices are grabbed.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1B is a schematic cross-sectional view of the structure with micro device depicted in FIG. 1A.

DESCRIPTION OF EMBODIMENTS

Figure 1A:
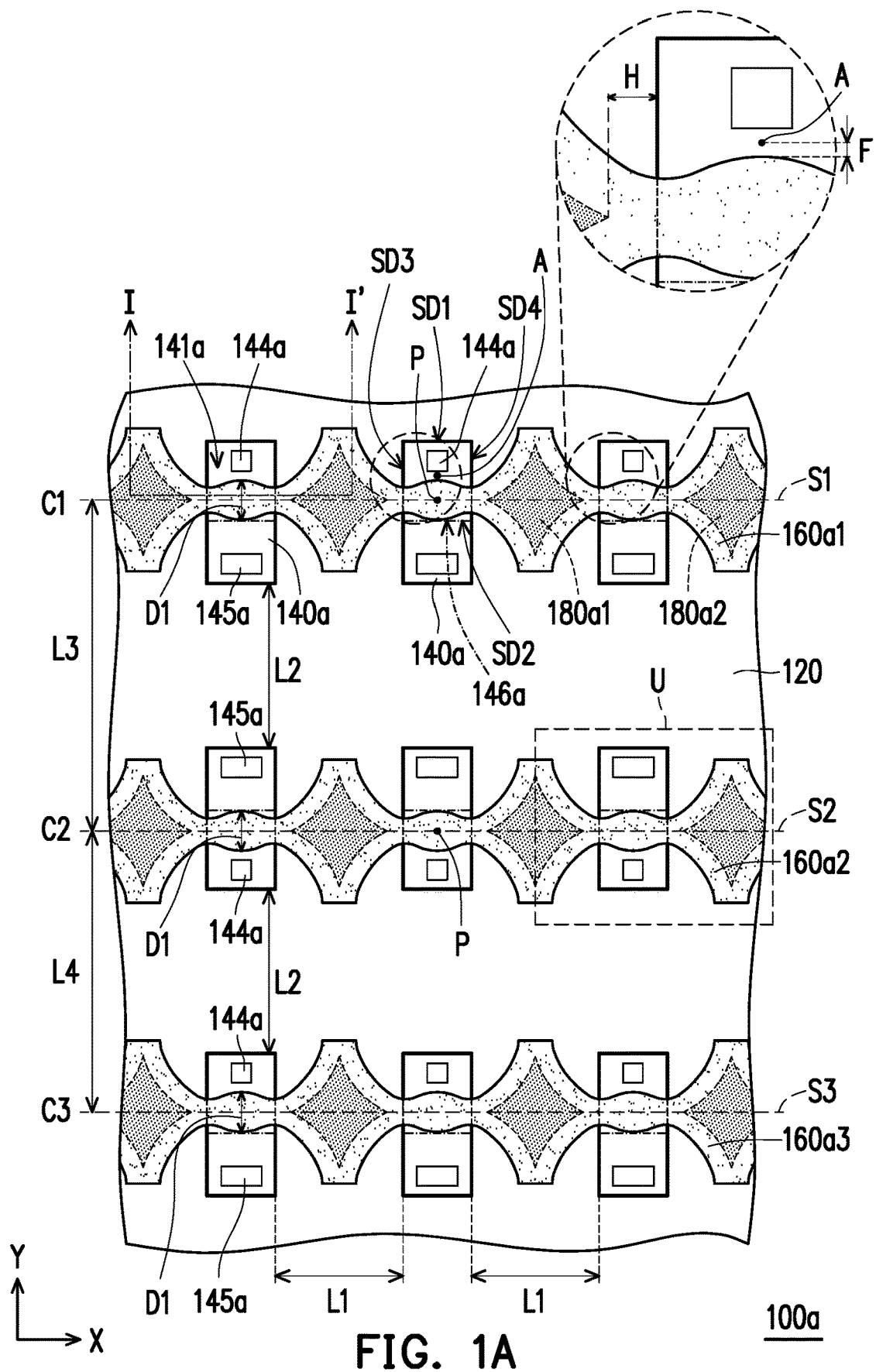
FIG. 1A is a schematic top view of a structure with micro device according to an embodiment of the invention.

The embodiments of the invention describe a structure of micro devices (e.g., micro light emitting diodes (LEDs) and microchips) which are ready to be picked up and transferred to a circuit substrate. For example, a receiving substrate may be a display substrate, a light-emitting substrate, a substrate having functional devices, such as transistors or integrated circuits (ICs) or a substrate having metal redistribution lines, which is not limited in the invention. Even though some of the embodiments of the invention are specific to describe micro LEDs including p-n diodes, it should be understood that the embodiments of the invention are not limited thereto, and some of the embodiments may also be applied to other micro semiconductor devices. Those devices may be designed according to such manner to control execution of a predetermined electron function (e.g., diode, transistor, integrated circuit) or photon function (e.g., LED, laser). FIG. 1A is a schematic top view of a structure with micro device according to an embodiment of the invention. FIG. 1B is a schematic cross-sectional view of the structure with micro device depicted in FIG. 1A. It should be mentioned that FIG. 1B is illustrated along a line I-I' in FIG. 1A. Referring to FIG. 1A and FIG. 1B simultaneously, a structure with micro device 100a provided in the present embodiment includes a substrate 120, a plurality of micro devices 140a (schematically illustrated as multiple micro devices in FIG. 1A) and a plurality of holding structures 160a1, 160a2 and 160a3 (which are schematically illustrated as three holding structures in FIG. 1A). The micro devices 140a are disposed on the substrate 120 and arranged in a plurality of rows C1, C2 and C3 (which are schematically illustrated as three rows in FIG. 1A). Each of the micro devices 140a has a top surface 141a. In this case, each of the rows C1, C2 and C3 is arranged along an X-axial direction, but the invention is not limited thereto, and in other embodiments, is may be applicable in the same way as if each of the rows C1, C2 and C3 is arranged along the same direction. The holding structures 160a1, 160a2 and 160a3 are disposed on the substrate 120. The holding structures 160a1, 160a2 and 160a3 are respectively disposed on the top surface 141a of each of the micro devices 140a and extend to the substrate 120. Specially, distances between one of the holding structures 160a1, 160a2 and 160a3 on the micro devices 140a on any one of the rows and the others of the holding structures 160a1, 160a2 and 160a3 on the micro devices 140a on two adjacent rows are different.

Specifically, the substrate 120 is a temporary substrate which is capable of being fixed and has a flat surface, for example, a plastic substrate, a glass substrate or a sapphire substrate, but the invention is not limited thereto. Referring to again to FIG. 1A, by viewing from the top, the micro devices 140a are arranged with an interval L1 on the rows C1, C2 and C3, an interval L2 is between the micro devices 140a arranged on the row C1 and the micro devices 140a arranged on the row C2, and the interval L2 is between the micro devices 140a arranged on the row C2 and the the micro devices 140a arranged on the row C3, wherein the intervals L1 and L2 may be the same to achieve a preferable process yield. In embodiments that are not shown, the intervals L1 and L2 may be different, which is not particularly limited in invention. It should be specially noted that in the present embodiment, the intervals L2 between the micro devices 140a on any one of the rows C1, C2 and C3 and the micro device on adjacent two of the rows C1, C2 and C3 are the same, and the intervals L1 between two adjacent micro devices 140a on any one of the rows C1, C2 and C3 are the same. In this case, the micro devices 140a are, for example, micro light emitting diodes (LEDs), and a maximum size of each of the micro devices 140a is less than or equal to 100 μm, such that the micro devices 140a may be subsequently transferred, integrated and assembled to a heterogeneous integration system which includes displays having substrates in various sizes. In other embodiments, the micro devices may also be micro integrated circuits (ICs), micro laser diodes (LDs) or micro sensors, which are not particularly limited in invention. In the present embodiment, the micro devices 140a are embodied as horizontal-type micro devices, for example, horizontal-type micro LEDs. Each of the micro devices 140a includes a first-type electrode 144a and a second-type electrode 145a, wherein the first-type electrodes 144a are located on the top surfaces 141a, and the holding structures 160a1, 160a2 and 160a3 are far away from the first-type electrodes 144. In other words, the first-type electrodes 144a are located on the top surfaces 141a, and the holding structures 160a1, 160a2 and 160a3 do not directly contact the first-type electrodes 144, but the invention is not limited thereto. In other embodiments that are not shown, it may also be the second-type electrodes being located on the top surfaces, and the holding structures do not directly contact the second-type electrodes. The first-type electrodes 144a and the second-type electrode 145a have opposite electrical properties. In the present embodiment, the first-type electrodes 144a are, for example, P-type electrodes, and the second-type electrodes 145a are, for example, N-type electrodes. However, in other embodiments, the first-type electrodes 144a may also be N-type electrodes, and the second-type electrodes 145a may also be P-type electrodes, which is not particularly limited in invention. It should be noted that the top surface 141a of each of the micro devices 140a refers to a surface corresponding to a position of a light-emitting layer 146a of each of the micro devices 140a.

Referring again to FIG. 1A, the top surface 141a of each of the micro devices 140a has four edges SD1, SD2, SD3 and SD4, wherein the edges SD1 and SD2 are disposed opposite to each other, and the edges SD3 and SD4 are disposed opposite to each other. It should be mentioned that a contour of each of the micro devices 140a of the present embodiment is embodied as a rectangular shape in the top view, but the invention is not limited thereto. In other embodiments that are not shown, the contour of each of the micro devices in the top view may be other adaptive shapes, such as a square shape, a circular shape or a trapezoidal shape.

Furthermore, as illustrated in FIG. 1A and FIG. 1B, each of the holding structures 160a1, 160a2 and 160a3 of the present embodiment directly and continuously covers the top surface 141a of each of the micro devices 140a on the rows C1, C2 and C3. In other embodiments, each of the holding structures 160a1, 160a2 and 160a3 may also discontinuously cover the top surface 141a of each of the micro devices 140a on the rows C1, C2 and C3. Specially, the holding structure 160a1 on the row C1, the holding structure 160a2 on the row C2 and the holding structure 160a3 on the row C3 are separated from one another, but the invention is not limited thereto. In addition, a part of the holding structure 160a2 is disposed on the substrate 120, and another part of the holding structure 160a2 is disposed on the micro devices 140a. Within a unit area U, an orthographic projection area of the holding structure 160a2 on the substrate 120 is greater than an orthographic projection area of the micro devices 140a on the substrate 120, thereby achieving a more preferable holding effect.

Figure 2A:
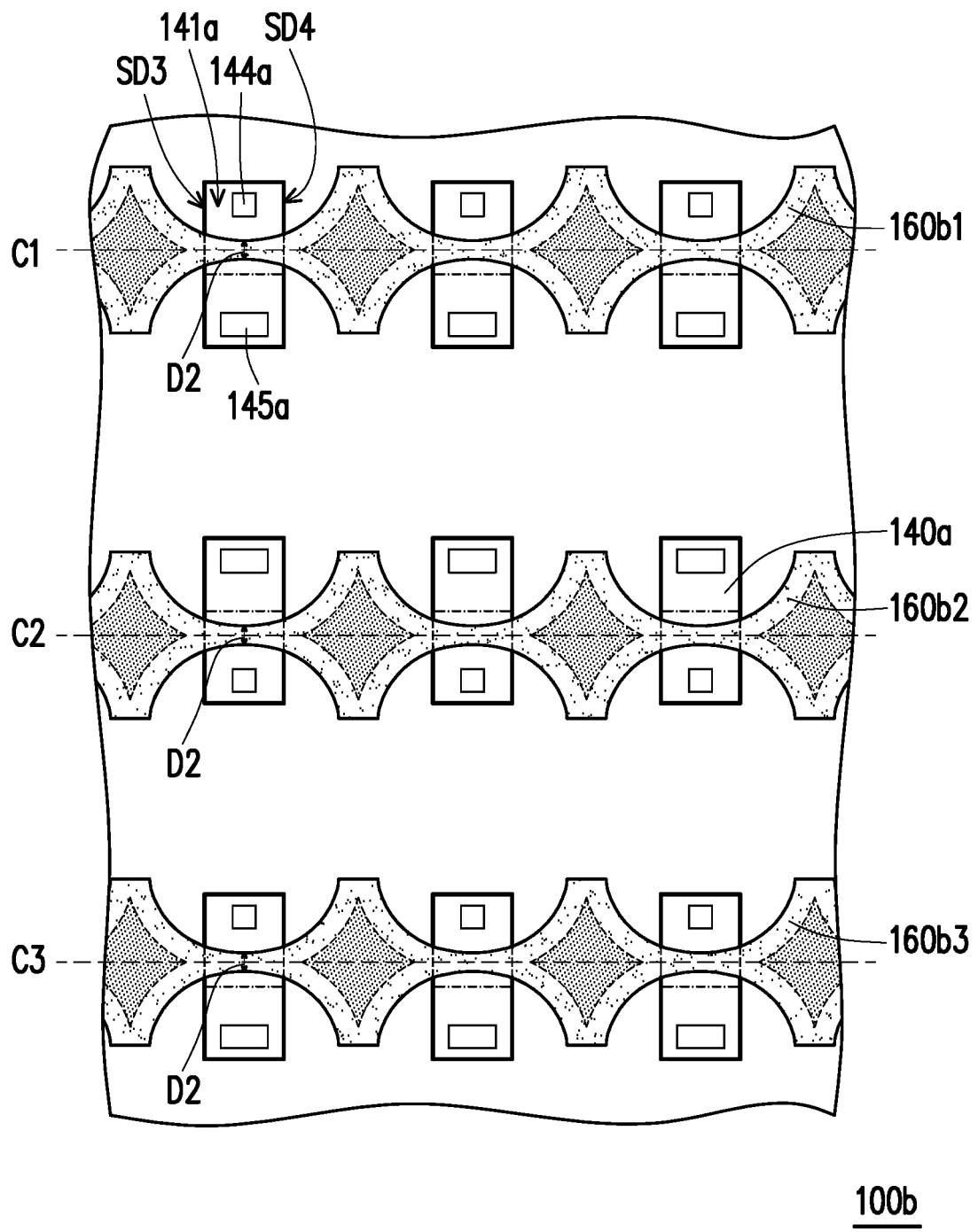
FIG. 2A and FIG. 2B are schematic top views of a structure with micro device according to several embodiments of the invention.

In the present embodiment, the second-type electrodes 145a of the micro devices 140a arranged on the row C1 and the second-type electrodes 145a of the micro devices 140a arranged on the row C2 are adjacent to each other, and the first-type electrodes 144a of the micro devices 140a arranged on the row C2 and the first-type electrodes 144a of the micro devices 140a arranged on the row C3 are adjacent to each other. The distance between the holding structure 160a1 on the row C1 and the holding structure 160a2 on the row C2 is greater than the distance between the holding structure 160a2 on the row C2 and the holding structure 160a3 on the row C3. Furthermore, there is a first distance L3 between the holding structure 160a1 on the row C1 and the holding structure 160a2 on the row C2, there is a second distance L4 between the holding structure 160a2 on the row C2 and the holding structure 160a3 on the row C3, and the first distance L3 is greater than the second distance L4. For instance, the holding structure 160a1 on the top surfaces 141a of the micro devices 140a on the row C1 has a symmetric centerline S1, the holding structure 160a2 on the top surfaces 141a of the micro devices 140a on the row C2 has a symmetric centerline S2, and the holding structure 160a3 on the top surfaces 141a of the micro devices 140a on the row C3 has a symmetric centerline S3. The first distance L3 is the distance between the symmetric centerline S1 on the row C1 and the symmetric centerline S2 on the row C2, and the second distance L4 is the distance between the symmetric centerline S2 on the row C2 and the symmetric centerline S3 on the row C3. In other embodiments, the first distance L3 and the second distance L4 may also be defined by other identical comparison bases of the holding structures 160a1, 160a2 and 160a3 on the top surfaces 141a of the micro devices 140a, which may be, for example, selected from distances between the centers on the edges SD3 of the holding structures 160a1, 160a2 and 160a3 on the top surfaces 141a of the micro devices 140a, or selected from minimal distances between the holding structures 160a1, 160a2 and 160a3 of the micro devices 140a by viewing from the top, but the invention is not limited thereto. Preferably, a ratio of the second distance L4 to the first distance L3 is, for example, less than 1 and greater than or equal to 0.6. It should be mentioned that in the present embodiment, the first-type electrodes 144a and the second-type electrodes 145a of the micro devices 140a are disposed in different directions on the odd rows (i.e., the rows C1 and C3) and the even row (i.e., the row C2), such that distances between gravity centers P of the micro devices 140a on the odd rows (i.e., the rows C1 and C3) and a gravity center P of the micro devices 140a on the even row (i.e., the row C2) are also different. Through the distances between the holding structures 160a1, 160a2 and 160a3 on the micro devices 140a on the rows being different from each other, a transfer process may be more stable, thereby increasing a transfer yield. It should be specially mentioned that a width D1 of each of the holding structures 160a1, 160a2 and 160a3 is gradually reduced from the centers of the top surfaces 141a toward the corresponding edges SD3 and SD4 of the top surfaces 141a, such that the holding structures 160a1, 160a2 and 160a3 may have maximal contact areas on the top surfaces 141a and have minimal contract areas on the corresponding edges SD3 and SD4. Thereby, the holding structures 160a1, 160a2 and 160a3 may have preferable fixing strength for being easily picked up in the subsequent transfer process. In other embodiments, in a structure with micro device 100b illustrated in FIG. 2A, a width D2 of each of the holding structures 160b1, 160b2 and 160b3 is gradually increased from the centers of the top surfaces 141a toward the corresponding edges SD3 and SD4 of the top surfaces 141a, thereby preventing the holding structures 160a1, 160a2 and 160a3 from directly contacting the first-type electrodes 144a or the second-type electrodes 145a during a manufacturing process to increase a process margin.

In addition, the orthographic projections of the holding structures 160a1, 160a2 and 160a3 on the substrate 120 overlap an orthographic projection of the gravity center P of each of the micro devices 140a on the substrate 120. It should be noted that the holding structures 160a1, 160a2 and 160a3 being disposed on the gravity centers of the micro devices 140a, the micro devices 140a, when being transported and transferred between different transfer substrates, may be provided with not only preferable fixing, supporting and connection via the holding structures 160a1, 160a2 and 160a3, but also provided with an average force to grab the micro devices 140a, thereby preventing an issue of an uneven grabbing force. It should be noted that there is a distance F between each of the holding structures 160a1, 160a2 and 160a3 of the present embodiment and a center A of the top surface 141a of each of the micro devices 140a, namely, the two do not overlap with each other and an extension direction of each of the holding structures 160a1, 160a2 and 160a3 does not pass through the center A of the top surface 141a of each of the micro devices 140a, such that the holding structures 160a1, 160a2 and 160a3 may be disposed collectively on the gravity centers P of the micro devices 140a. The center A in this case refers to a geometric center of each of the top surfaces 141a.

Figure 1C:
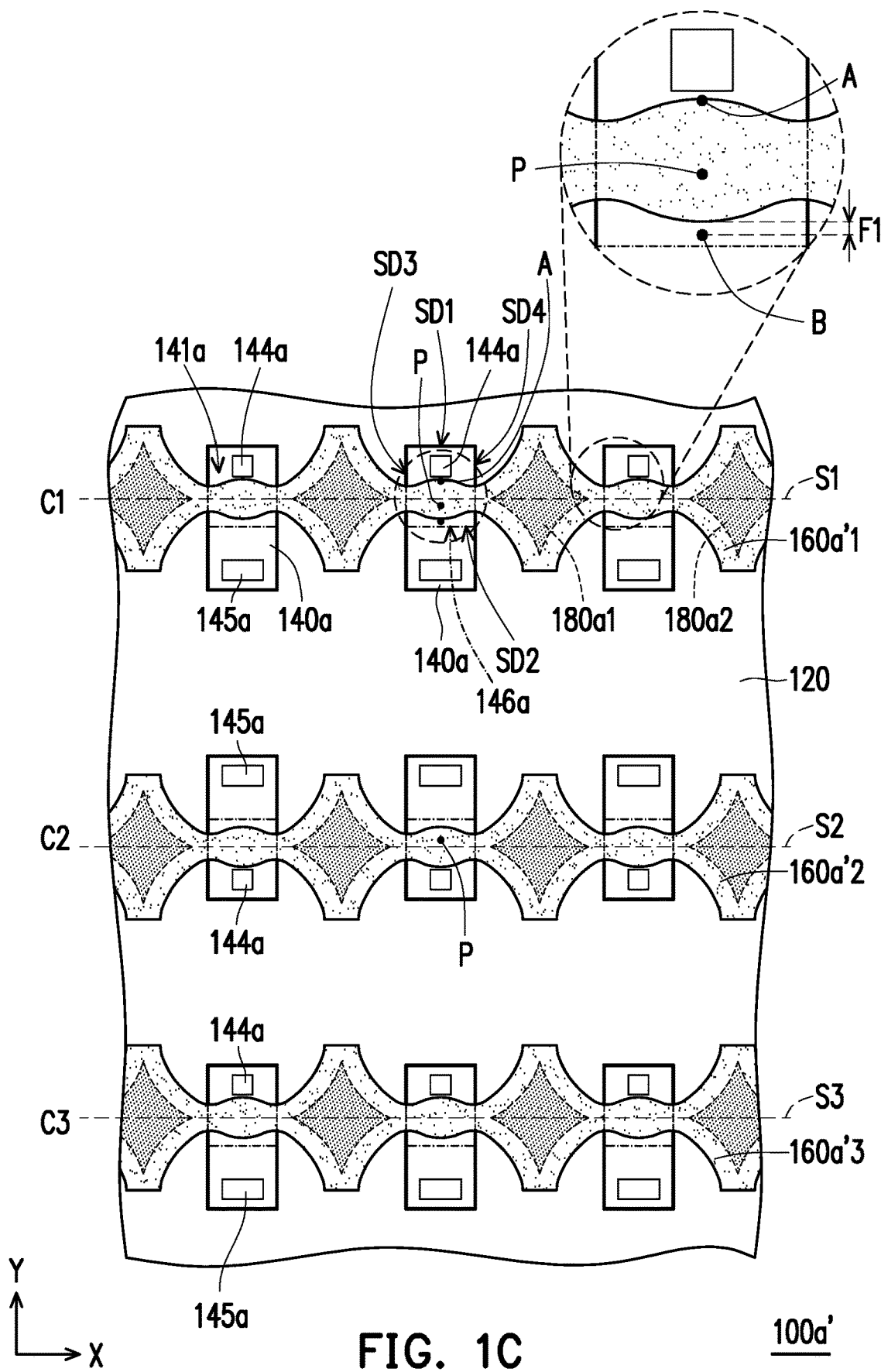
FIG. 1C is a schematic top view of a structure with micro device according to another embodiment of the invention.

It should be mentioned that the holding structures 160a1, 160a2 and 160a3 of the structure with micro device 100a of the present embodiment do not overlap the center A of the top surface 141a of each of the micro devices 140a. However, in another embodiment, referring to FIG. 1C, holding structures 160a'1, 160a'2 and 160a'3 of a structure with micro device 100a' may also overlap the center A of the top surface 141a of each of the micro devices 140a, and it still pertains to the scope sought for protection by the invention as long as the holding structures 160a'1, 160a'2 and 160a'3 are disposed collectively on the gravity centers P of the micro devices 140a. In addition, an orthographic projection of each of the holding structures 160a'1, 160a'2 and 160a'3 on the substrate 120 and an orthographic projection of a center B of each of the micro devices 140a on the substrate 120 do not overlap with each other and have a distance F1 therebetween, such that the holding structures 160a'1, 160a'2 and 160a'3 may be disposed more collectively on the gravity centers P of the micro devices 140a.

Figure 2B:
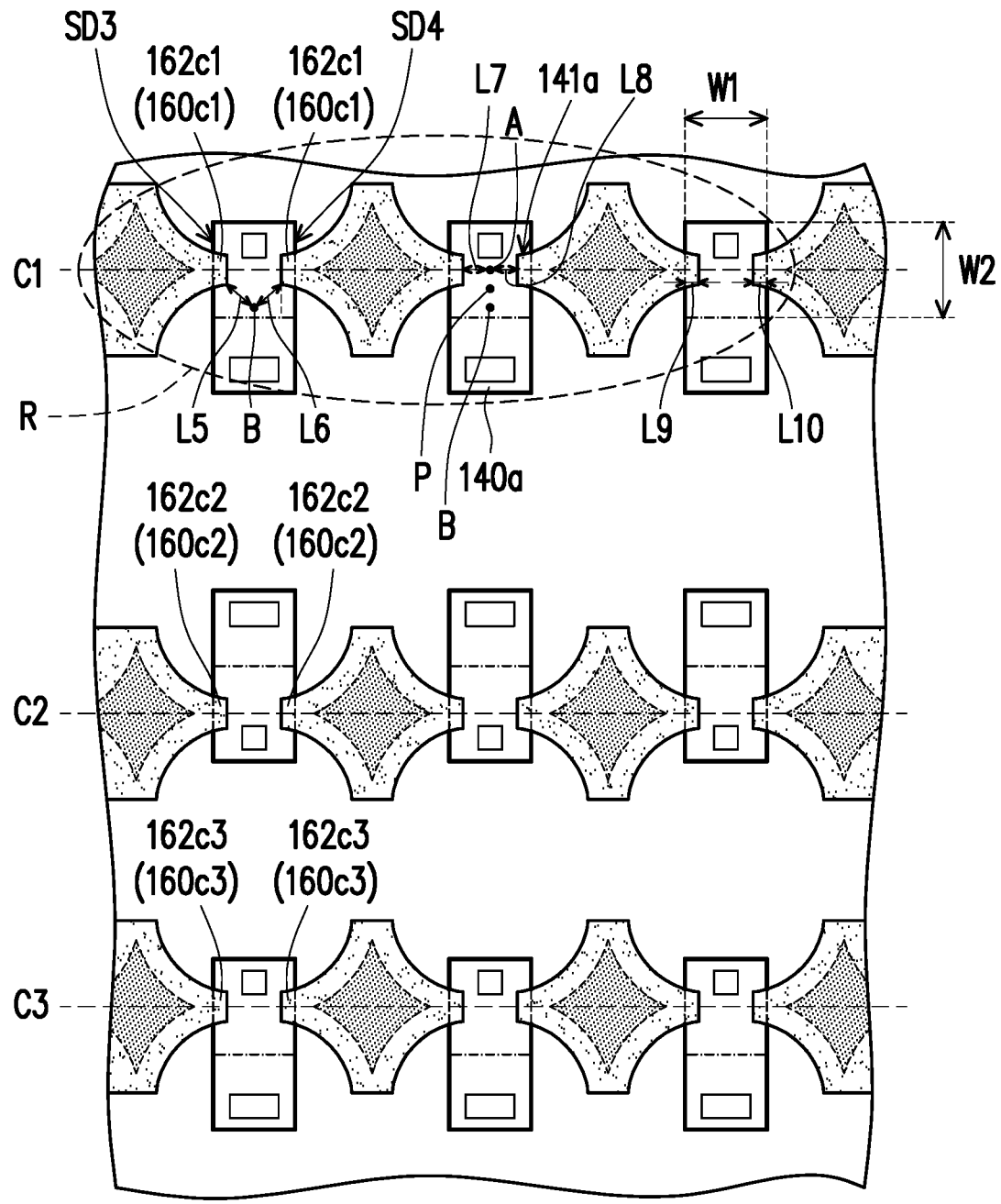
Figure 2C:
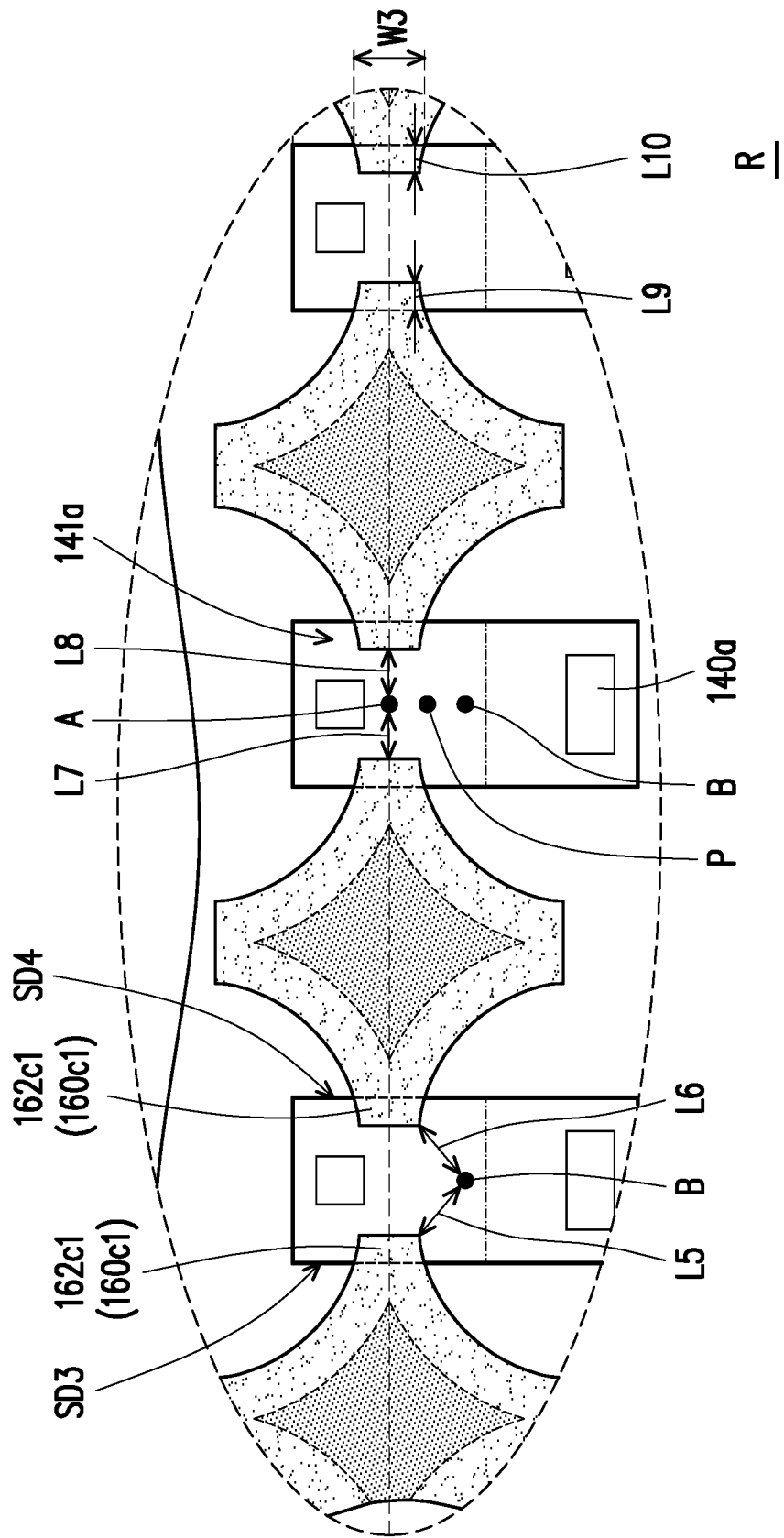
FIG. 2C is a magnified schematic view of an area R of FIG. 2B.

Referring to FIG. 2B to FIG. 2C simultaneously, FIG. 2C is a magnified schematic view of an area R of FIG. 2B. In the present embodiment, a holding structure 160c1 includes a plurality of holding portions 162c1, each of the holding portions 162c1 is disposed on the edges SD3 and SD4, wherein a ratio of a width W3 of each of the holding portions 162c1 on the edges SD3 and SD4 to a side length W2 of the corresponding edges SD3 and SD4 may be, for example, between 0.01 and 0.6. When the ratio is less than 0.01, it represents an insufficient holding force, and when the ratio is greater than 0.6, it represents that the subsequent pick-up and transfer process may be affected. In this case, the holding portions 162c1 are separated from each other and respectively located on the edges SD3 and SD4 which are opposite to each other on each of the micro devices 140a on the row C1. In other embodiments, the holding portions may also be continuously and simultaneously disposed on the edges SD3 and SD4 which are opposite to each other, but the invention is not limited thereto. In the same way, a holding structure 160c2 has a plurality of holding portions 162c2, and the holding portions 162c2 are separated from each other and respectively located on the edges SD3 and SD4 which are opposite to each other on each of the micro devices 140a on the row C2. A holding structure 160c3 has a plurality of holding portions 162c3, and the holding portions 162c3 are separated from each other and respectively located on the edges SD3 and SD4 which are opposite to each other on each of the micro devices 140a on the row C3. In this case, each of extension directions of the holding portions 162c1, 162c2 and 162c3 of the holding structures 160c1, 160c2 and 160c3 passes through a center of the two edges SD3 and SD4 on the top surface 141a of each of the micro devices 140a on the rows C1, C2 and C3. Specially, orthographic projections of the holding portions 162c1, 162c2 and 162c3 of the holding structures 160c1, 160c2 and 160c3 on the substrate 120 do not overlap an orthographic projection of the center B of each of the micro devices 140a on the substrate 120.

Taking the holding portion 162c1 of the holding structure 160c1 as an example for description, the extension direction between the holding portions 162c1 passes the center of the two edges SD3 and SD4 of the top surface 141a of each of the micro devices 140a, i.e., passes through the center A of the top surface 141a. Minimal distances L5 and L6 between orthographic projections of the holding portions 162c1 on the edges SD3 and SD4 which are opposite to each other on each of the micro devices 140a on the substrate 120 and the orthographic projection of the center B of each of the micro devices 140a on the substrate 120 are the same. Minimal distances L7 and L8 between the holding portions 162c1 on the edges SD3 and SD4 which are opposite to each other on each of the micro devices 140a and the center A of the top surface 141a of each of the micro devices 140a are the same. The minimal distances L7 and L8 between the center A of the top surface 141a of each of the micro devices 140a and the holding portions 162c1 on the edges SD3 and SD4 which are opposite to each other on each of the micro devices 140a are smaller than ½ of a minimal side length W1 of the top surface 141a. In this case, W1 is, for example, less than or equal to 50 μm, and L7 and L8 are, for example, less than 20 μm, but the invention is not limited thereto. There are maximal distances L9 and L10 between the holding portions 162c1 and the edges SD3 and SD4 of the corresponding top surfaces 141a, and a ratio of the maximal distances L9 and 10 to the side length W2 of the two edges SD3 and SD4 of the corresponding micro device 141a is less than or equal to 0.2. The maximal distances L9 and L10 are, for example, less than or equal to 20 μm, and if the maximal distance is greater than 20 μm, it increases the difficulty in the pick-up process. It should be specially mentioned that the holding structures 160c1, 160c2 and 160c3 illustrated in FIG. 2B are symmetrically disposed on the top surface 141a of each of the micro devices 140a, thereby providing a preferable subsequent transfer yield.

In brief, in a structure with micro device 100c of the present embodiment, with the holding structures 160c1, 160c2 and 160C3 disposed on the top surfaces 141a of the micro devices 140a and the extension directions of the holding structures 160c1, 160c2 and 160c3 passing through the center A of the top surface 141a of each of the micro devices 140a, the micro devices 140a, when being transported and transferred between different transfer substrates, may be provided with not only preferable fixing, supporting and connection via the holding structures 160c1, 160c2 and 160c3, but also provided with an average force to grab an micro devices 140a, thereby preventing an issue of an uneven grabbing force.

Figure 2D:
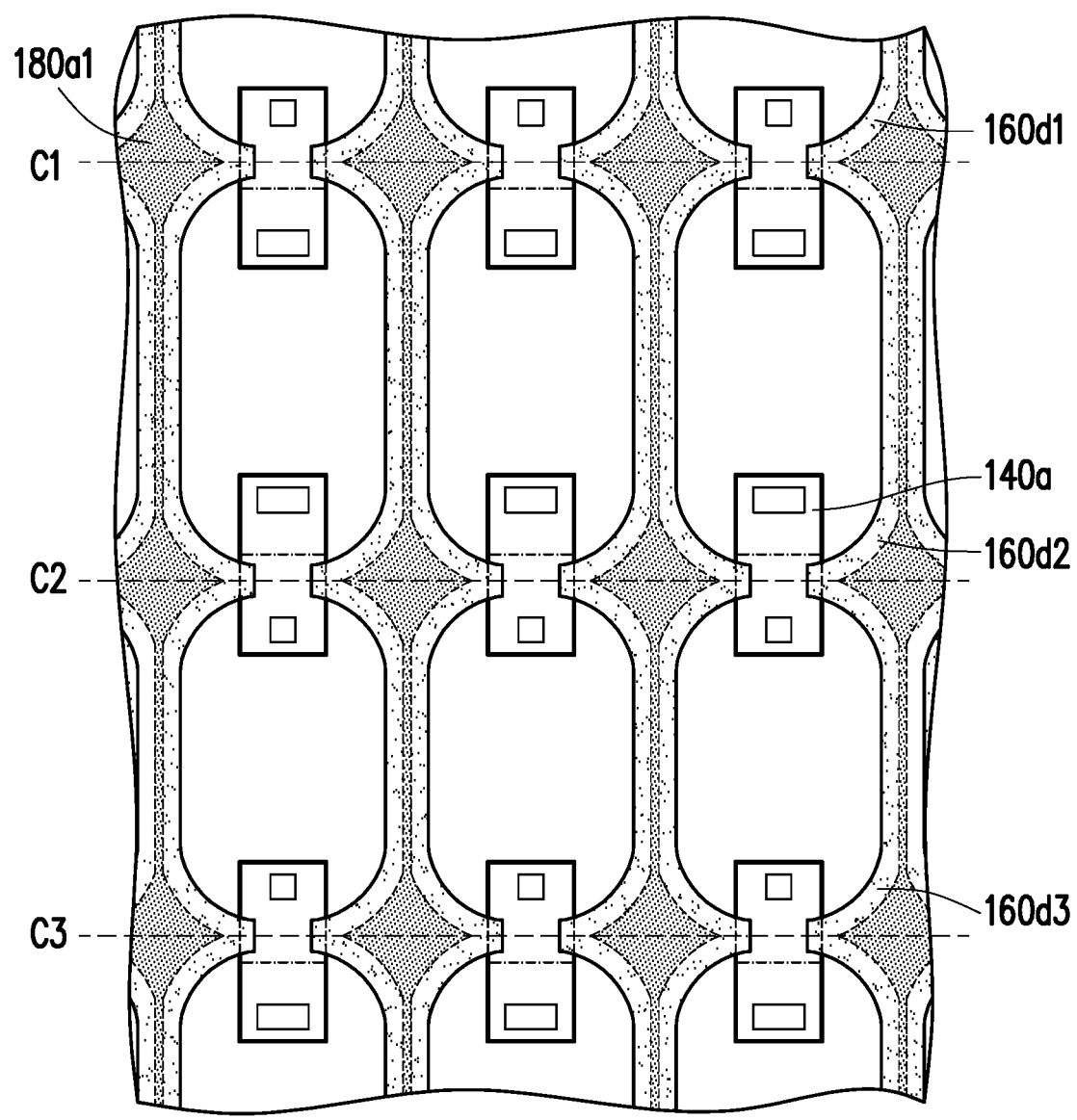
FIG. 2D is a schematic top view of a structure with micro device according to an embodiment of the invention.

It should be noted that in the present embodiment, the holding structure 160c1 on the row C1, the holding structure 160c2 on the row C2 and the holding structure 160c3 on the row C3 are separated from one another, but the invention is not limited thereto. However, in another embodiment, referring to FIG. 2D, in a structure with micro device 100d, a holding structure 160d1 on the row C1, a holding structure 160d2 on the row C2 and a holding structure 160d3 on the row C3 may also be connected together, which still falls within the scope sought for protection by the invention.

In addition, referring again to FIG. 1B, each of the micro devices 140a further includes a bottom surface 142a opposite to the top surface 141a and a peripheral surface 143a connected with the top surface 141a and the bottom surface 142a. In the present embodiment, the structure with micro device 100a may further selectively include a plurality of buffer structures 180a1 and 180a2, wherein the buffer structures 180a1 and 180a2 are disposed between the holding structure 160a1 (or the holding structure 160a2 or 160a3) and the substrate 120 and directly contact the holding structure 160a1 (or the holding structure 160a2 or 160a3). Namely, the holding structure 160a1 (or the holding structure 160a2 or 160a3) of the present embodiment does not directly contact the substrate 120 and is connected to the substrate 120 through the buffer structures 180a1 and 180a2. In this case, referring to FIG. 1A, an orthographic projection of the holding structure 160a1 (or the holding structure 160a2 or 160a3) on the substrate 120 overlaps orthographic projections of the buffer structures 180a1 and 180a2 on the substrate 120.

In the present embodiment, the holding structure 160a1 (or the holding structure 160a2 or 160a3) is made of a material different from a material of the buffer structures 180a1 and 180a2, and a Young's modulus of the holding structure 160a1 (or the holding structure 160a2 or 160a3) is greater than that of the buffer structures 180a1 and 180a2. Thus, the buffer structures 180a1 and 180a2 are capable of buffering. In this case, the holding structure 160a1 (or the holding structure 160a2 or 160a3) is made of, for example, an inorganic material, and the buffer structures 180a1 and 180a2 are made of, for example, an organic material. In this case, the buffer structures 180a1 and 180a2 are far away from the micro devices 140a, i.e., the buffer structures 180a1 and 180a2 do not directly contact the micro devices 140a. Referring to FIG. 1A, the orthographic projections of the buffer structures 180a1 and 180a2 on the substrate 120 may not overlap the orthographic projections of the micro devices 140a on the substrate 120. Within the unit area U, a ratio of an orthographic projection area of the buffer structures 180a1 and 180a2 on the substrate 120 to an orthographic projection area of the holding structure 160a1 (or the holding structure 160a2 or 160a3) on the substrate 120 is between 0.2 and 0.9. In brief, the buffer structures 180a1 and 180a2 of the present embodiment does not directly contact the micro devices 140a, and thus, the buffer structures 180a1 and 180a2 may not only absorb affection by external forces during the process of transporting and transferring the micro devices 140a held by the holding structure 160a1 (or the holding structure 160a2 or 160a3) to improve the transportation and transfer yield, but also not affect the pick-up yield of the micro devices 140a.

To be more specific, the orthographic projections of the buffer structures 180a1 and 180a2 on the substrate 120 are separated from the orthographic projections of the micro devices 140a on the substrate 120 by a minimal distance H, and preferably, the minimal distance H is less than or equal to 10 μm. Referring to FIG. 1B, there may be an air gap G1 among the holding structure 160a1 (or the holding structure 160a2 or 160a3), the substrate 120 and the buffer structures 180a1 and 180a2. In addition, a vertical distance between the micro devices 140a and the substrate 120 is, for example, between 0.1 μm and 5 μm. In the present embodiment, an area of the buffer structures 180a1 and 180a2 contacting the holding structure 160a1 (or the holding structure 160a2 or 160a3) is greater than an area of the buffer structures 180a1 and 180a2 contacting the micro devices 140a.

In brief, in the design of the structure with micro device 100a of the present embodiment, the micro devices 140a are arranged on the rows C1, C2 and C3 on the substrate 120, and the holding structures 160a1, 160a2 and 160a3 are respectively disposed on the top surface 141a of each of the micro devices 140a, and the distances L3 and L4 between one of the holding structures (e.g., the holding structure 160a2) on the micro devices 140a on any one of the rows (e.g., the row C2) and the other two of the holding structures (e.g., the holding structures 160a1 and 160a3) on the micro devices 140a on two adjacent rows (e.g., the rows C1 and C3) are different. In this way, when the micro devices 140a are transported and transferred between different transfer substrates, they may be provided with preferable fixing, supporting and connection via the holding structures 160a1, 160a2 and 160a3, so as to average the force when the micro devices 140a are grabbed.

It should be noted that the reference numerals and a part of the contents in the previous embodiment are used in the following embodiments, in which identical reference numerals indicate identical or similar components, and repeated description of the same technical contents is omitted. The description related to the omitted parts can be found in the previous embodiment, and no repeated description is contained in the following embodiments.

Figure 3A:
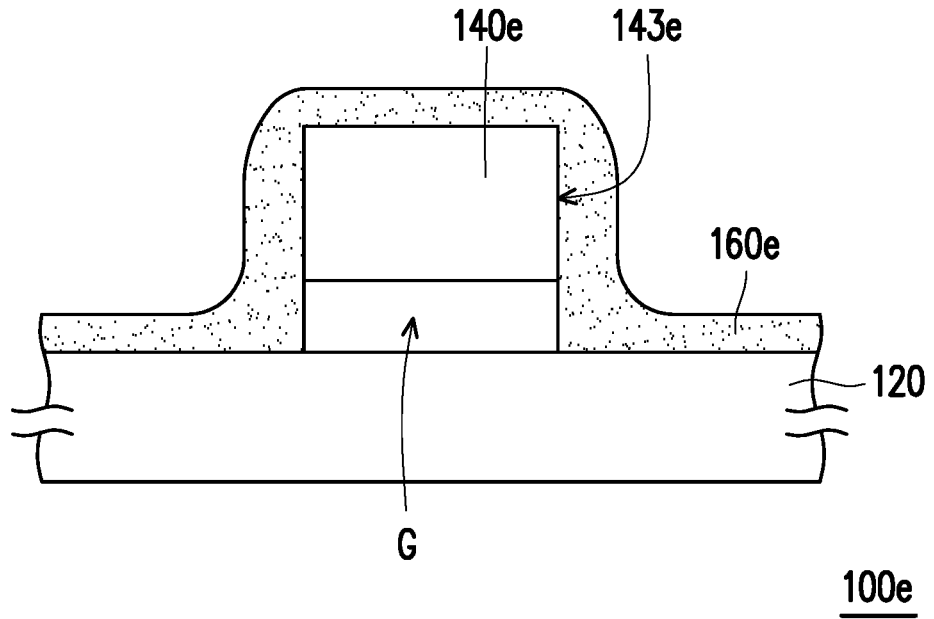
FIG. 3A and FIG. 3G are schematic cross-sectional views of a structure with micro device according to several embodiments of the invention.

FIG. 3A is a schematic cross-sectional view of a structure with micro device according to another embodiment of the invention. Referring to FIG. 1B and FIG. 3A simultaneously, a structure with micro device 100e of the present embodiment is similar to the structure with micro device 100a illustrated in FIG. 1B, and a difference therebetween lies in that: the structure with micro device 100e of the present embodiment does not have any buffer structure, wherein a holding structure 160e directly contacts the substrate 120, and the holding structure 160e directly contacts a peripheral surface 143e of a micro device 140e. In this case, there is an air gap G among the micro device 140e, the holding structure 160e and the substrate 120. In addition, a cross-sectional shape of the micro device 140e of the present embodiment is, for example, a rectangular shape, but the invention is not limited thereto.

Figure 3B:
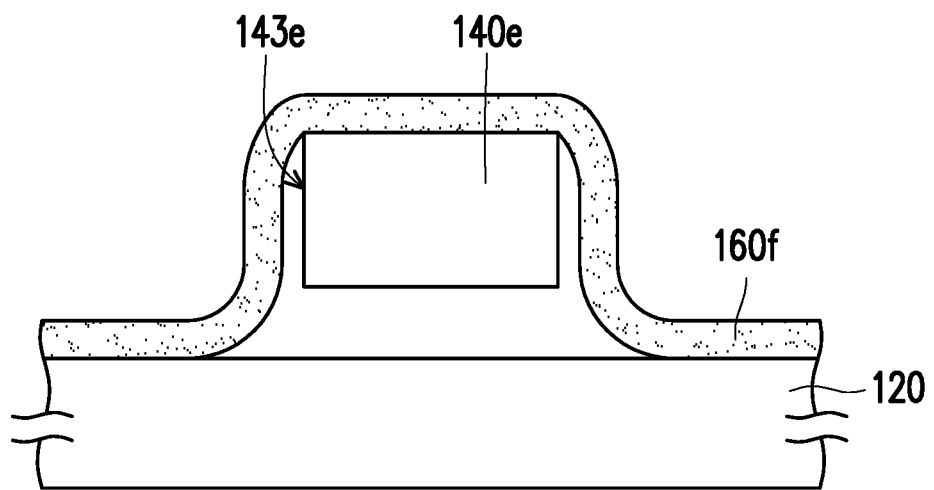

FIG. 3B is a schematic cross-sectional view of a structure with micro device according to another embodiment of the invention. Referring to FIG. 3A and FIG. 3B simultaneously, a structure with micro device 100f of the present embodiment is similar to the structure with micro device 100e illustrated in FIG. 3A, and a difference therebetween lies in that: a holding structure 160f of the structure with micro device 100f of the present embodiment does not directly contact the peripheral surface 143e of the micro device 140e.

Figure 3C:
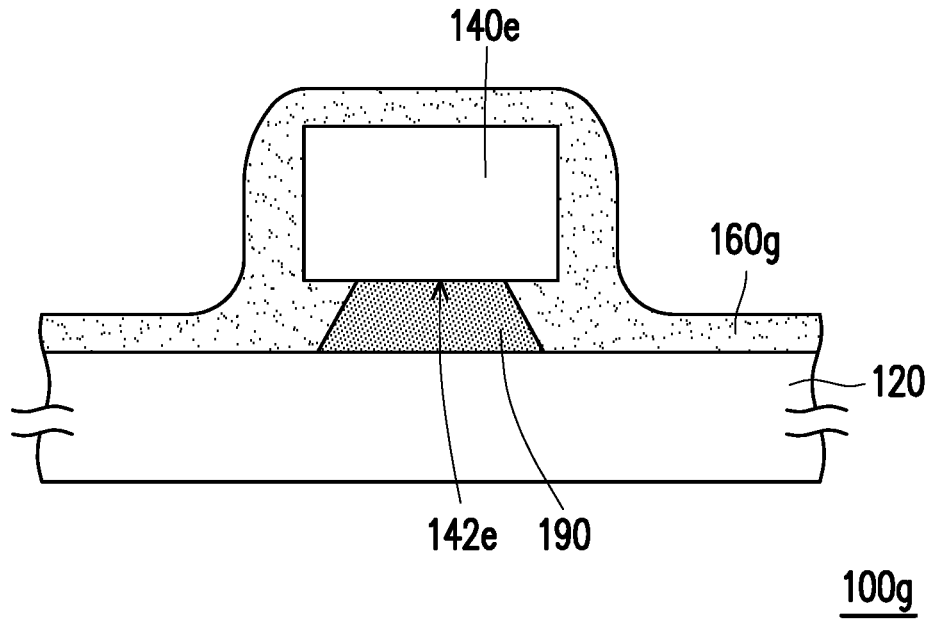

FIG. 3C is a schematic cross-sectional view of a structure with micro device according to another embodiment of the invention. Referring to FIG. 3A and FIG. 3C simultaneously, a structure with micro device 100g of the present embodiment is similar to the structure with micro device 100e illustrated in FIG. 3A, and a difference therebetween lies in that: a holding structure 160g of the structure with micro device 100g of the present embodiment further extends to cover a part of a bottom surface 142e of the micro device 140e. In addition, the structure with micro device 100g of the present embodiment further includes a buffer layer 190, wherein the buffer layer 190 is disposed between the bottom surface 142e of the micro device 140e and the substrate 120 and directly contacts the holding structure 160g and the micro device 140e. In other words, there is no air gap among the micro device 140e, the holding structure 160g and the substrate 120 in the present embodiment. In this case, the buffer layer 190 may absorb a stress generated when the micro device 140e is bonded to the substrate 120, thereby increasing a bonding yield. In other words, the buffer layer 190 may provide a stress buffering effect between the micro device 140e and the substrate 120. Preferably, a Young's modulus of the buffer layer 190 is less than that of the holding structure 160g. In this case, the buffer layer 190 is made of a foaming material or an organic polymer material, such that the buffer layer 190 has a plurality of irregular air holes, wherein a porosity rate of the buffer layer 190 made of the foaming material may be greater than or equal to 50%, thereby providing a preferable buffering effect.

Figure 3D:
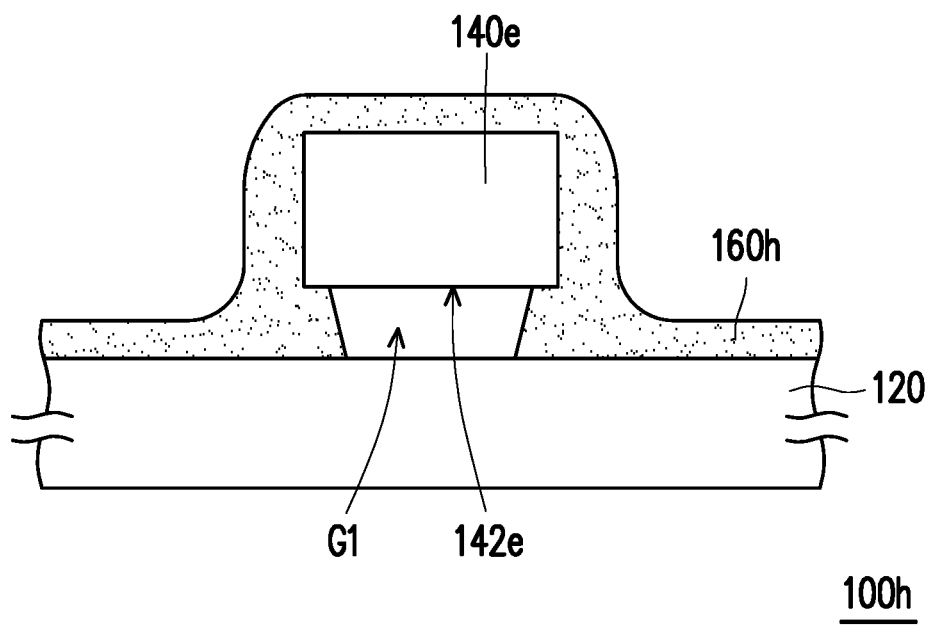

FIG. 3D is a schematic cross-sectional view of a structure with micro device according to another embodiment of the invention. Referring to FIG. 3A and FIG. 3D simultaneously, a structure with micro device 100$h$ of the present embodiment is similar to the structure with micro device 100$g$ illustrated in FIG. 3C, and a difference therebetween lies in that: the structure with micro device 100$h$ of the present embodiment is not provided with any buffer layer, and thus, there is an air gap G1 among the micro device 140$e$, a holding structure 160$h$ and the substrate 120.

Figure 3E:
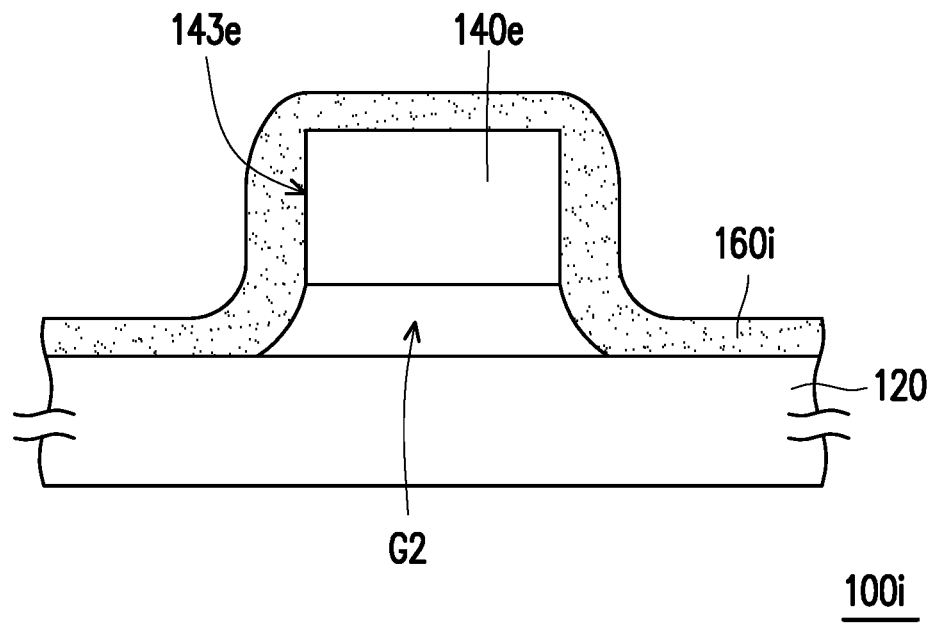

FIG. 3E is a schematic cross-sectional view of a structure with micro device according to another embodiment of the invention. Referring to FIG. 3A and FIG. 3E simultaneously, a structure with micro device 100$i$ of the present embodiment is similar to the structure with micro device 100$e$ illustrated in FIG. 3A, and a difference therebetween lies in that: a holding structure 160$i$ of the present embodiment totally covers the peripheral surface 143$e$ of the micro device 140$e$, and there is an air gap G2 among the micro device 140$e$, the holding structure 160$i$ and the substrate 120.

Figure 3F:
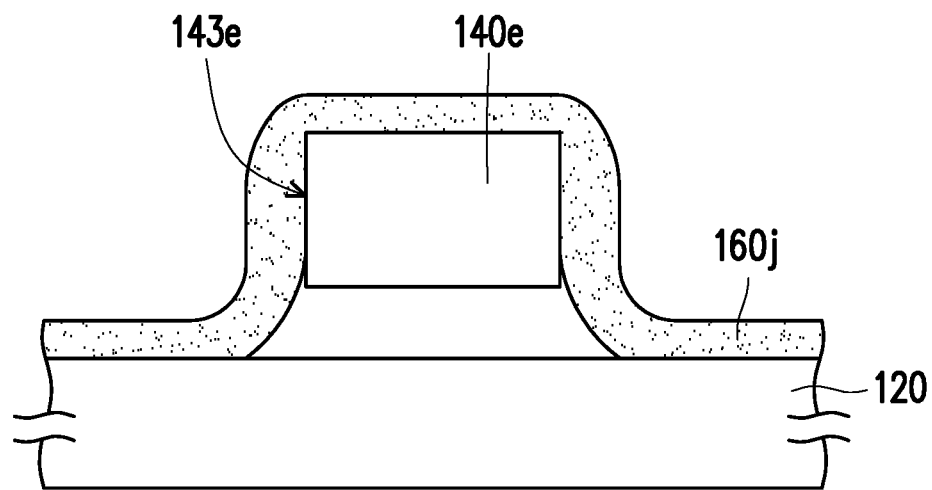

FIG. 3F is a schematic cross-sectional view of a structure with micro device according to another embodiment of the invention. Referring to FIG. 3A and FIG. 3F simultaneously, a structure with micro device 100$j$ of the present embodiment is similar to the structure with micro device 100$e$ illustrated in FIG. 3A, and a difference therebetween lies in that: a holding structure 160$j$ of the present embodiment does not totally cover the peripheral surface 143$e$ of the micro device 140$e$. Namely, the holding structure 160$j$ merely covers a part of the peripheral surface 143$e$ of a micro device 140$e$.

Figure 3G:
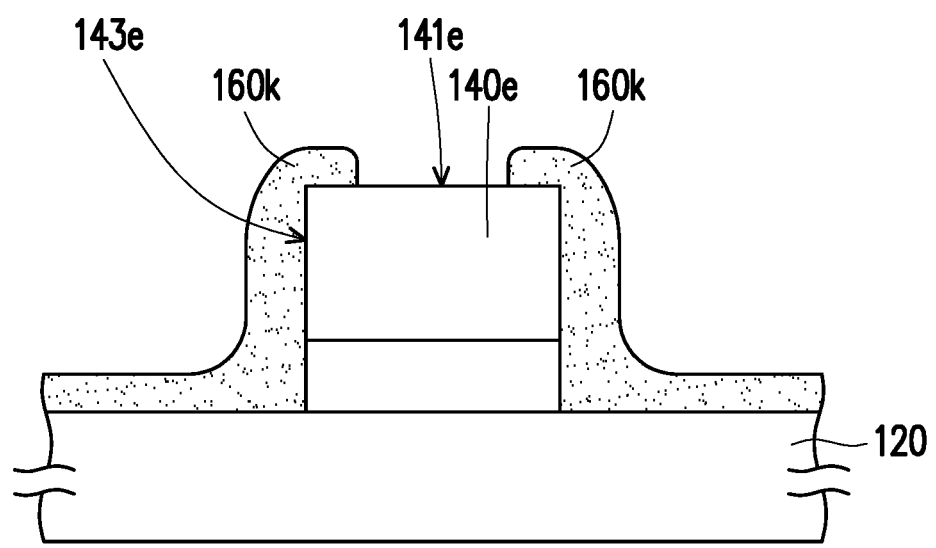

FIG. 3G is a schematic cross-sectional view of a structure with micro device according to another embodiment of the invention. Referring to FIG. 3A and FIG. 3G simultaneously, a structure with micro device 100$k$ of the present embodiment is similar to the structure with micro device 100$e$ illustrated in FIG. 3A, and a difference therebetween lies in that: holding portions 162$k$ of a holding structure 160$k$ of the present embodiment do not pass through a center of a width of a top surface 141$e$ of the micro device 140$e$. Namely, only a part of the holding structure 160$k$ covers the top surface 141$e$ to cover the peripheral surface 143$e$ and extend to cover the substrate 120.

Figure 4A:
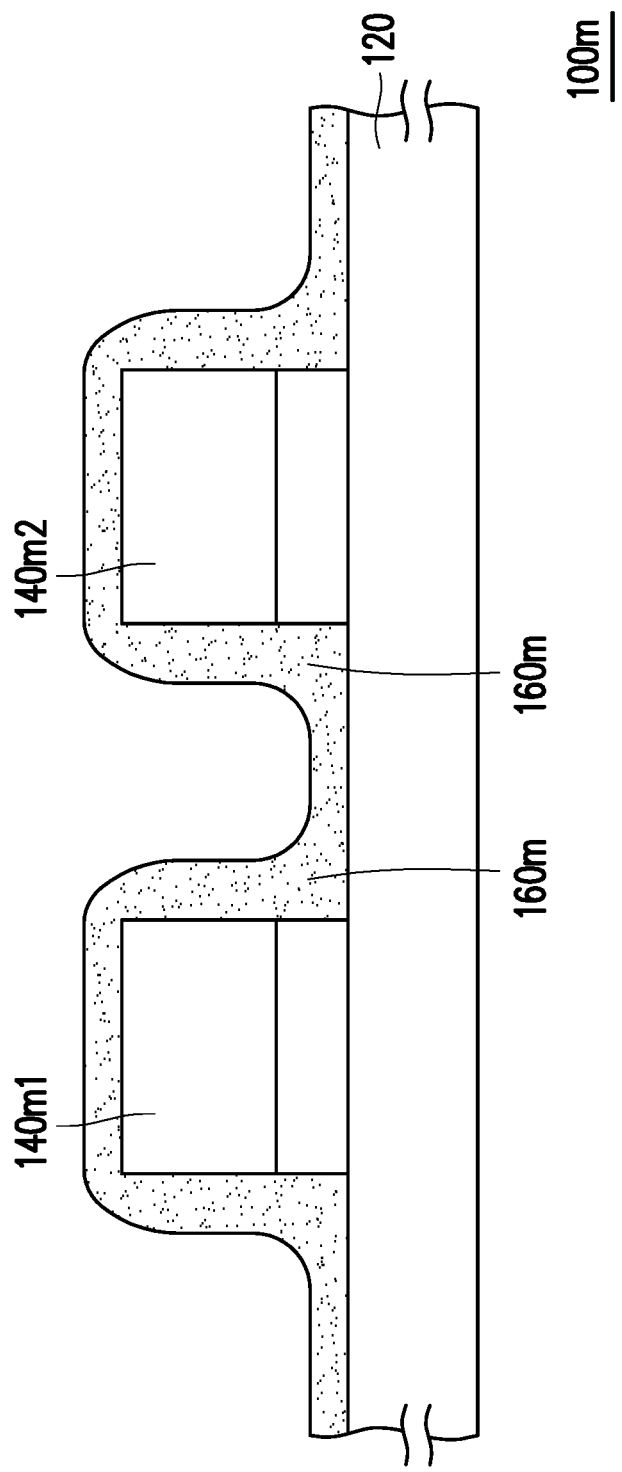
FIG. 4A and FIG. 4B are schematic cross-sectional views of a structure with micro device according to a plurality of embodiments of the invention.

FIG. 4A is a schematic cross-sectional view of a structure with micro device according to another embodiment of the invention. Referring to FIG. 3A and FIG. 4A simultaneously, a structure with micro device 100$m$ of the present embodiment is similar to the structure with micro device 100$e$ illustrated in FIG. 3A, and a difference therebetween lies in that: the structure with micro device 100$m$ includes a plurality of micro devices 140$m$1 and 140$m$2, wherein the two adjacent micro devices 140$m$1 and 140$m$2 are connected to each other through a holding structure 160$m$.

Figure 4B:
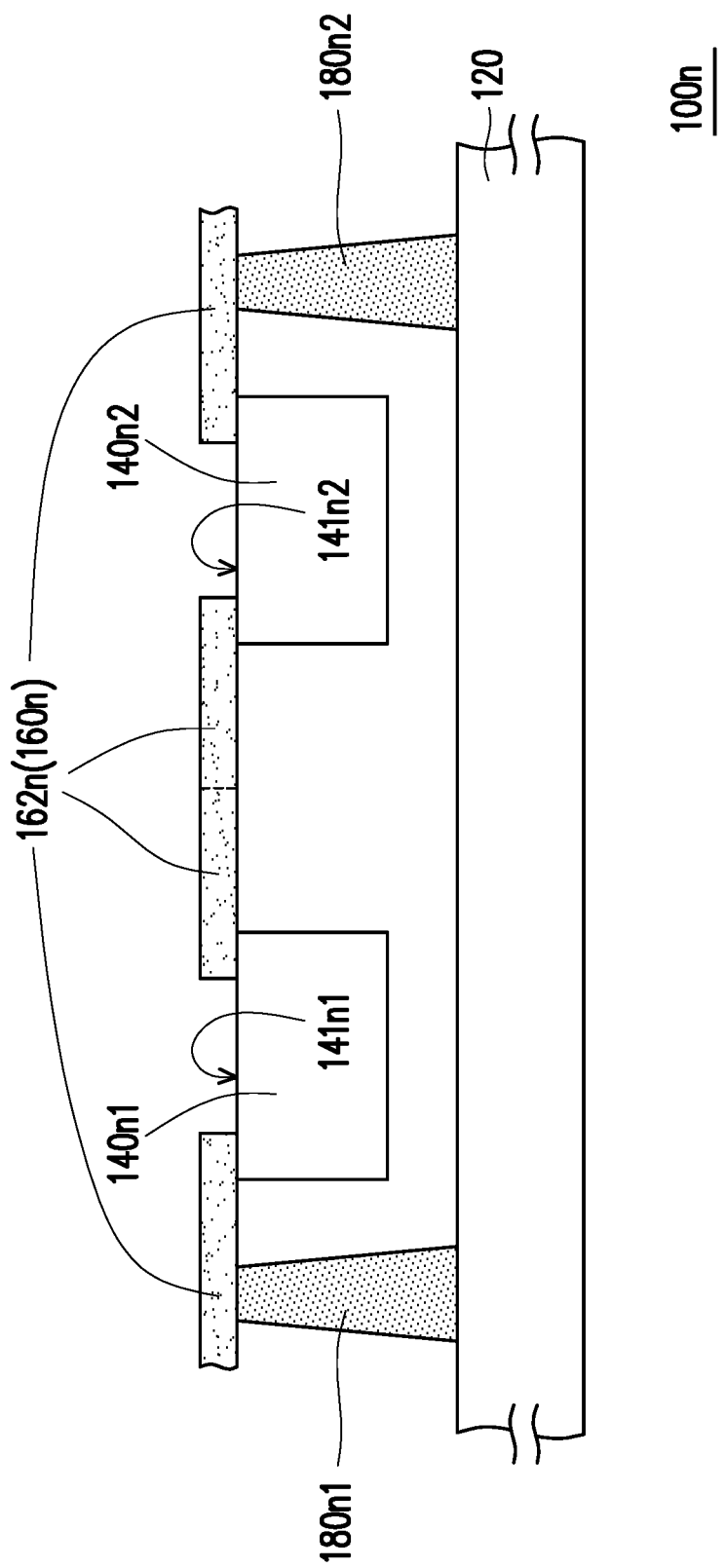

FIG. 4B is a schematic cross-sectional view of a structure with micro device according to another embodiment of the invention. Referring to FIG. 4A and FIG. 4B simultaneously, a structure with micro device 100$n$ of the present embodiment is similar to the structure with micro device 100$m$ illustrated in FIG. 4A, and a difference therebetween lies in that: the structure with micro device 100$n$ of the present embodiment further includes a plurality of buffer structures 180$n$1 and 180$n$2, wherein holding portions 162$n$ of a holding structure 160$n$ are respectively connected to the substrate 120 through the buffer structures 180$n$1 and 180$n$2, and two adjacent micro devices 140$n$1 and 140$n$2 are connected to each other through the holding portions 162$n$ of the holding structure 160$n$. In this case, the holding portions 162$n$ do not pass through centers of widths of top surfaces 141$n$1 and 141$n$2 of the micro devices 140$n$1 and 140$n$2, but the invention is not limited thereto.

Based on the above, in the design of the structure with micro device of the invention, the micro devices are disposed on the substrate and arranged in multiple rows, and the holding structures are respectively disposed on the top surface of each of the micro devices and extend to cover the substrate. The distances between the holding structure on any one of the micro devices and the holding structures on the micro devices on two adjacent rows are different. With this design, in addition to the process margin being increased, the micro devices, when being transported and transferred between different substrates, can be provided with preferable fixing, supporting and connection via the holding structures, so as to average the force when the micro devices are grabbed.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A structure with micro device, comprising:
   a substrate;
   a plurality of micro devices, disposed on the substrate and arranged in a plurality of rows, and each of the plurality of micro devices having a top surface facing away from the substrate; and
   a plurality of holding structures, respectively disposed on the top surface of each of the plurality of micro devices and extending to the substrate, wherein distances between the plurality of holding structure on the top surface of the plurality of micro devices on any one of the rows and the plurality of holding structures on the top surface of the plurality of micro devices on two adjacent rows are different.

2. The structure with micro device according to claim 1, wherein each of the plurality of micro devices comprises a first-type electrode and a second-type electrode, the first-type electrode or the second-type electrode is located on the top surface, and the plurality of holding structures are away from the first-type electrodes or the second-type electrodes.

3. The structure with micro device according to claim 2, wherein orthographic projections of the plurality of holding structures on the substrate overlap an orthographic projection of a gravity center of each of the plurality of micro devices on the substrate.

4. The structure with micro device according to claim 3, wherein there is a distance between the plurality of holding structures and a center of the top surface of each of the plurality of micro devices.

5. The structure with micro device according to claim 3, wherein the plurality of holding structures overlap a center of the top surface of each of the plurality of micro devices.

6. The structure with micro device according to claim 5, wherein there is a distance between the orthographic projection of each of the plurality of holding structures on the substrate and an orthographic projection of a center of each of the plurality of micro devices on the substrate.

7. The structure with micro device according to claim 2, the first-type electrodes or the second-type electrodes of the plurality of micro devices on two adjacent rows are adjacent to each other, and a ratio of a first distance between the adjacent holding structures corresponding to the second-type electrodes on two adjacent rows to a second distance between the adjacent holding structures corresponding to the first-type electrodes on two adjacent rows is less than 1 and greater than or equal to 0.6.

8. The structure with micro device according to claim 1, wherein each of the plurality of holding structures comprises at least one holding portion, the holding portion is located on an edge of each of the plurality of micro devices, and a ratio of a width of the holding portion on the edge to a side length of the edge is between 0.01 and 0.6.

9. The structure with micro device according to claim 8, wherein the at least one holding portion comprises a plurality of holding portions and the plurality of holding portions are separated from each other.

10. The structure with micro device according to claim 9, wherein a minimal distance between an orthographic projection of each of the plurality of holding portions on the substrate and the orthographic projection of the center of each of the plurality of micro devices on the substrate is the same.

11. The structure with micro device according to claim 9, wherein a minimal distance between each of the plurality of holding portions and a center of the top surface of each of the plurality of micro devices is the same.

12. The structure with micro device according to claim 11, wherein the minimal distance between the center of the top surface of each of the plurality of micro devices and each of the plurality of holding portions is less than or equal to ½ of a minimal side length of the top surface.

13. The structure with micro device according to claim 8, wherein there is a maximal distance between the holding portion and the corresponding edge of the top surface, and a ratio of the maximal distance to the side length of the corresponding edge of the micro device is less than or equal to 0.2.

14. The structure with micro device according to claim 1, further comprising:
a plurality of buffer structures, disposed between the plurality of holding structures and the substrate, wherein the plurality of holding structures are connected to the substrate through the plurality of buffer structures, and the material of the plurality of buffer structures is different from the material of the plurality of holding structures.

15. The structure with micro device according to claim 14, wherein within a unit area, a ratio of an orthographic projection area of the plurality of buffer structures on the substrate to an orthographic projection area of the plurality of holding structure on the substrate is between 0.2 and 0.9.

16. The structure with micro device according to claim 14, wherein the plurality of buffer structures are away from each of the plurality of micro devices.

17. The structure with micro device according to claim 16, wherein orthographic projections of the plurality of buffer structures on the substrate are separated from the orthographic projection of each of the plurality of micro devices on the substrate by a minimal distance, and the minimal distance is less than or equal to 10 μm.

18. The structure with micro device according to claim 1, wherein intervals between the plurality of micro devices on any one of the rows and the plurality of micro devices on two adjacent rows are the same.

19. The structure with micro device according to claim 1, wherein the holding structure on the plurality of micro devices on each of the rows has a symmetric centerline, and distances between the symmetric centerline on any one of the rows and the symmetric centerlines on two adjacent rows are different.

20. The structure with micro device according to claim 1, wherein distances between any two adjacent odd rows or any two adjacent even rows are the same.

21. A structure with micro device, comprising:
a substrate;
a plurality of micro devices, disposed on the substrate and arranged in a plurality of rows, and each of the plurality of micro devices having a top surface facing away from the substrate; and
a plurality of holding structures, respectively disposed directly on the top surface of each of the plurality of micro devices and directly contacting the substrate, wherein pitches between the plurality of holding structure on the top surface of the plurality of micro devices on any one of the rows and the plurality of holding structures on the top surface of the plurality of micro devices on two adjacent rows are different.

* * * * *